(12) United States Patent
Trammel

(10) Patent No.: US 6,419,502 B1
(45) Date of Patent: Jul. 16, 2002

(54) ELECTRICAL CONNECTOR ASSEMBLY WITH IMPROVED CONTACT ARRANGEMENT

(75) Inventor: John D. Trammel, Winston-Salem, NC (US)

(73) Assignee: Hon Hai Precision Ind. Co., Ltd., Taipei Hsien (TW)

(*) Notice: Subject to any disclaimer, the term of this patent is extended or adjusted under 35 U.S.C. 154(b) by 0 days.

(21) Appl. No.: 09/808,780

(22) Filed: Mar. 14, 2001

(51) Int. Cl.[7] .............................................. H01R 12/20
(52) U.S. Cl. .......................... 439/79; 439/76.1; 439/67
(58) Field of Search ........................... 439/79, 76.1, 67, 439/77, 492, 60, 924.1

(56) References Cited

U.S. PATENT DOCUMENTS

| | | | | |
|---|---|---|---|---|
| 5,584,708 A | * | 12/1996 | Leong .......................... | 439/79 |
| 5,609,490 A | * | 3/1997 | Beesch et al. ................. | 439/79 |
| 5,947,753 A | * | 9/1999 | Chapman et al. .............. | 439/79 |
| 5,997,312 A | * | 12/1999 | Ho et al. ....................... | 439/60 |
| 6,019,639 A | * | 2/2000 | Brunker et al. ................ | 439/60 |
| 6,129,562 A | * | 10/2000 | Hong ........................... | 439/79 |
| 6,220,868 B1 | * | 4/2001 | Pei et al. ....................... | 439/60 |

* cited by examiner

Primary Examiner—Gary Paumen
(74) Attorney, Agent, or Firm—Wei Te Chung

(57) ABSTRACT

An electrical connector assembly (1) for connecting to a cable includes a first connector (10), a second connector (20) mateable with the first connector, and a PCB (30). The first connector comprises a first housing (12) and a plurality of contacts (14) retained in the first housing. The contacts have mating portions (142) arranged in a single row for engaging with a corresponding terminal (24) of the second connector, and soldering portions (144) arranged in upper and lower rows for connecting to circuit traces (32, 36) of the PCB. The soldering portions are arranged in adjacent groups of three having a fine pitch for being soldered to corresponding circuit traces. Rows of second and fourth circuit traces (34, 38) are also formed on the PCB, having a larger spacing than the fine pitch of the soldering portions for facilitating soldering of corresponding conductors of the cable thereto.

1 Claim, 7 Drawing Sheets

ELECTRICAL CONNECTOR ASSEMBLY WITH IMPROVED CONTACT ARRANGEMENT

BACKGROUND OF THE INVENTION

1. Field of the Invention

The present invention relates to an electrical connector assembly, and particularly to an electrical connector assembly having an improvedcontact arrangement.

2. Description of Prior Art

As the demands for high bandwidth and low latency in computer technology increases, the emerging InfiniBand™ architecture is being developed by the information industry. InfiniBand architecture de-couples an I/O subsystem from memory by utilizing point-to-point connections rather than a shared bus. InfiniBand products are ideally suited for clustering, I/O extension, and native attachment in many network applications and can be used in high-performance server applications, providing a cost-effective transition from existing technologies.

To achieve the technology performance of the InfiniBand architecture, an InfiniBand product must provide a sufficiently large number of signal contacts with a fairly fine pitch for signal transmission. Each contact comprises a mating portion for engaging with a corresponding terminal of a complementary connector and a soldering portion opposite to the mating portion. The soldering portions are adapted for soldering to a corresponding number of first circuit traces formed on a printed circuit board (PCB). The PCB further forms another corresponding number of second circuit tracesfor electrically connecting the first circuit traces to corresponding conductors of a cable, thereby establishing point to point connections between the conductors of the cable and the signal contacts of the InfiniBand product. If using a conventional arrangement, the first and the second circuit traces will be very densely arranged in two parallel rows on one surface of the PCB to correspond to the soldering portions of the contacts. Therefore, the conductors of the cable will be very difficult to accurately solder to corresponding second circuit traces due to the structural limitation of the cable itself. Accordingly, one conductor may easily be soldered to an unmateable second circuit trace or may short to another conductor due an operator's carelessness.

Hence, an electrical connector assembly with an improved contact structure is required to overcome the disadvantages of the prior art.

BRIEF SUMMARY OF THE INVENTION

A main object of the present invention is to provide an electrical connector assembly having an improved contact arrangement for facilitating point-to-point connections with a cable An electrical connector assembly in accordance with the present invention comprises a first electrical connector, a second electrical connector mated with the first electrical connector and a PCB attached with the first connector. The first connector comprises a first main body and a plurality of conductive first contacts retained in the first main body and spaced apart from each other with a fine pitch distance. Each first contact comprises a retaining portion, and a mating portion and a soldering portion extending from opposite ends of the retaining portion. The mating portions are arranged in a single row and the soldering portions are arranged in alternating upper and lower groups extending along upper and lower rows. Each upper or lower group comprises three adjacent soldering portions each extending obliquely upward or downward from a corresponding retaining portion for soldering to a corresponding first and third circuit trace formed correspondingly on a top and a bottom surfaces of the PCB. A row of second and fourth circuit traces is formed adjacent to the first and third circuit traces, respectively, on the top and bottom surfaces of the PCB, respectively. The second and fourth circuit traces are spaced apart from each other by a distance much larger than the fine pitch distance between the first contacts. Two opposite ends of each second and fourth circuit trace are electrically connected with a corresponding first and third circuit trace and with a corresponding conductor of the cable, respectively. Since the distance between the second and fourth circuit traces is much larger, the conductors of the cable are easily and securely soldered thereto.

Other objects, advantages and novel features of the invention will become more apparent from the following detailed descriptionof the present embodiment when taken in conjunction with the accompanying drawings.

DETAILED DESCRIPTION OF THE INVENTION

Figure 1:
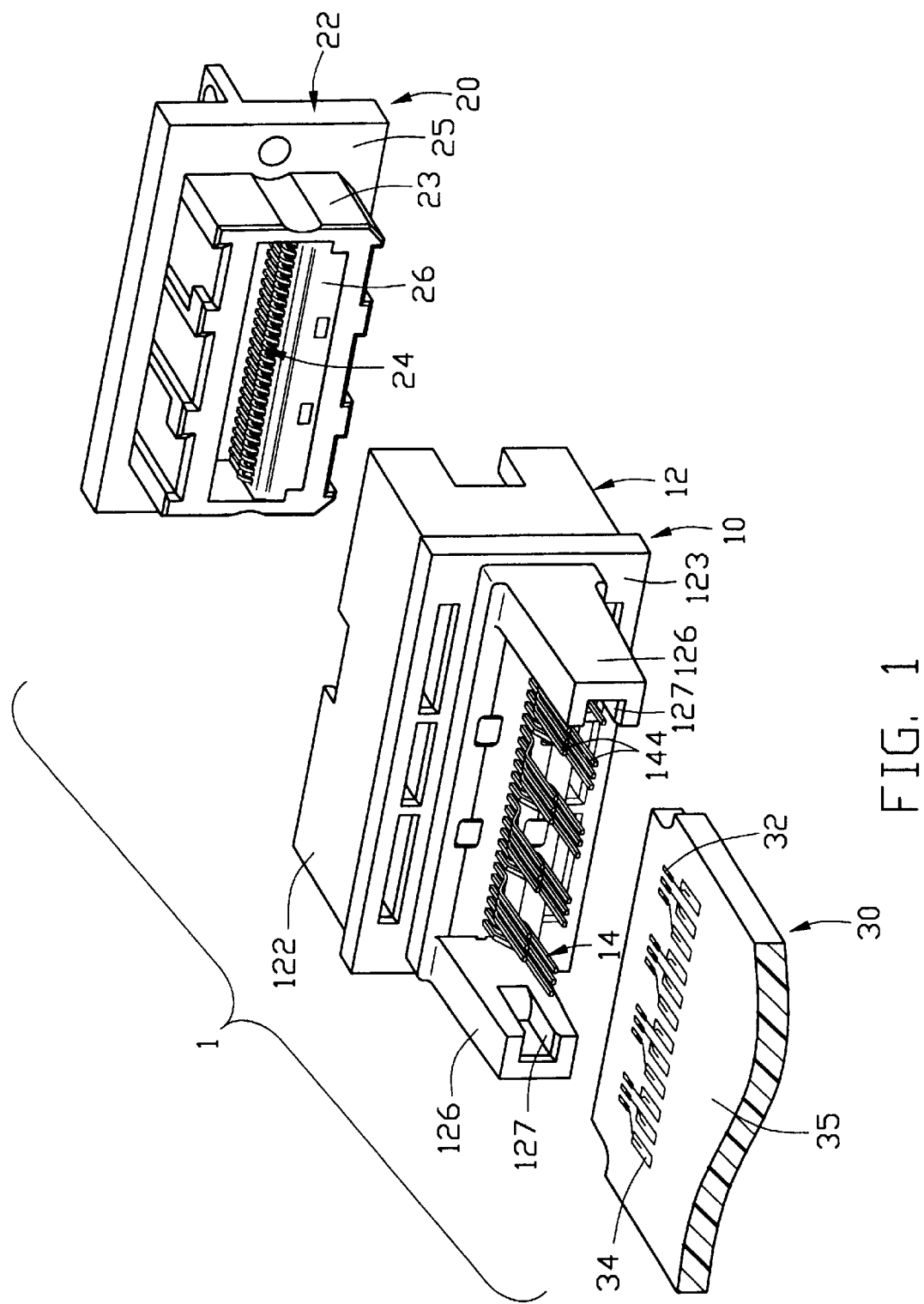
FIG. 1 is an exploded perspective view of an electrical connector assembly in accordance with the present invention.
Figure 2:
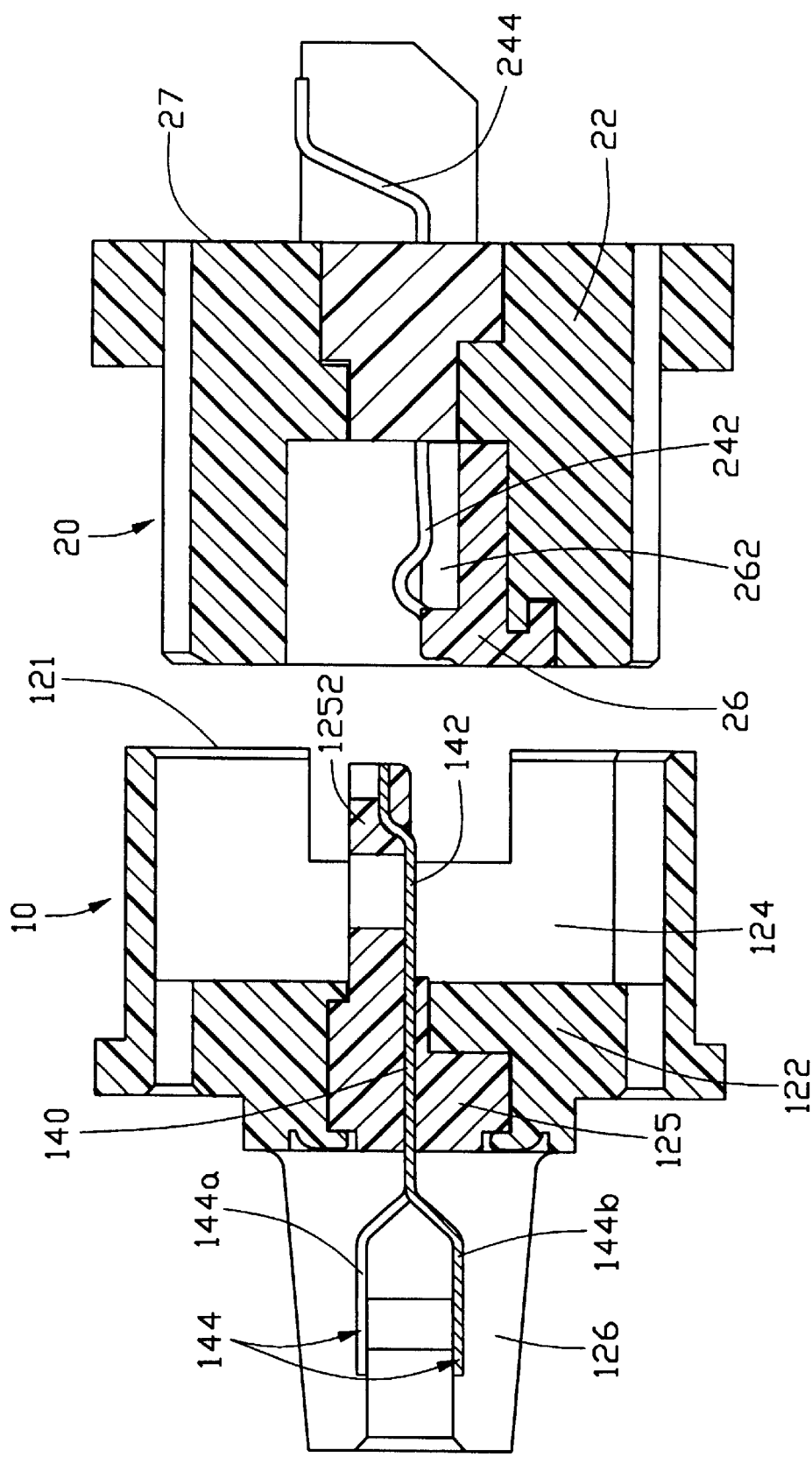
FIG. 2 is a cross-sectional view of the connectors of FIG. 1.

Referring to FIGS. 1 and 2, an InfiniBand™ electrical connector assembly 1 in accordance with the present invention, suitable for use with InfiniBand™ products, comprises an electrical first connector 10, an electrical second connector 20 for mating with the first connector 10, and a PCB 30 for connecting the electrical first connector 10 to a cable (not shown).

The second connector 20 comprises a second main body 22 and a row of conductive second terminals 24 retained in the second main body 22. The second main body 22 forms a shroud 23 extending rearward from a rear face 25 thereof. A second retaining block 26 is assembled into the shroud 23 and defines a plurality of channels 262. Each second terminal 24 comprises an engaging portion 242 accommodated in a corresponding channel 262 and a tail portion 244 extending forward from a front side 27 of the main body 22.

Figure 3:
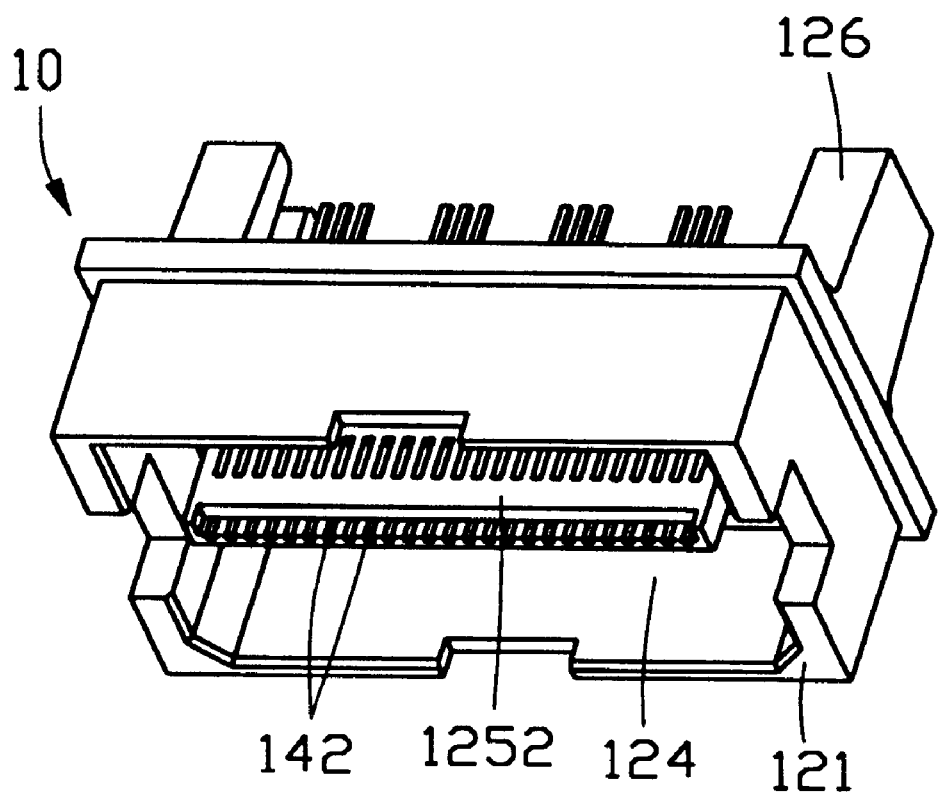
FIG. 3 is a perspective view of an electrical connector of FIG. 1 from another viewpoint.
Figure 4:
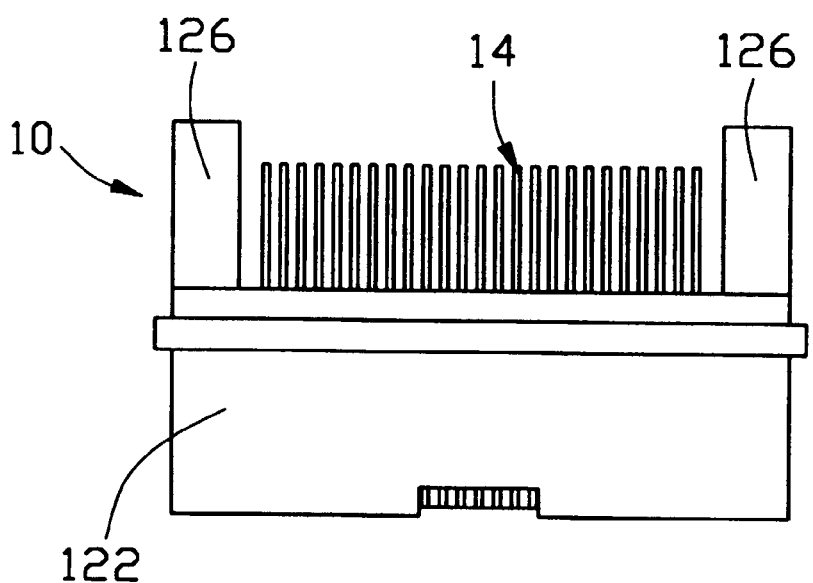
FIG. 4 is a top view of FIG. 3.
Figure 5:
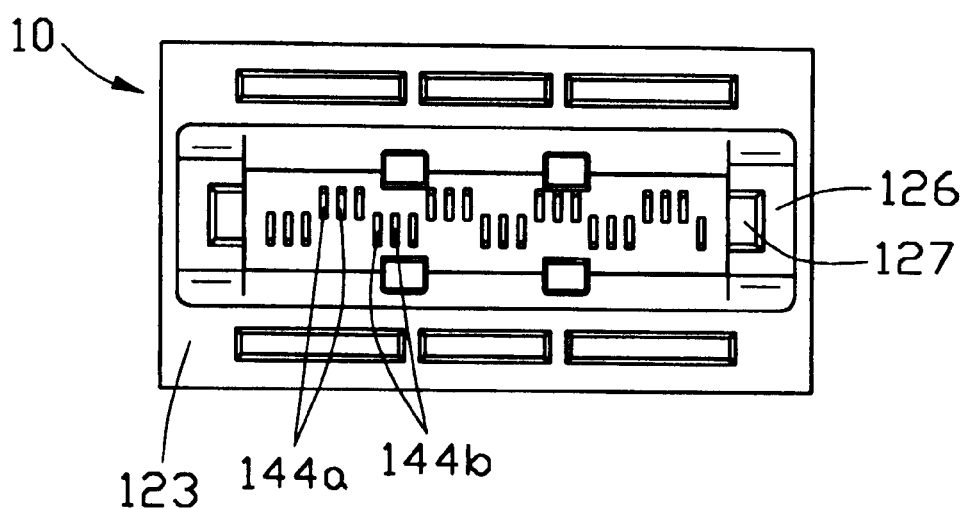
FIG. 5 is a back view of FIG. 3.

Further referring to FIGS. 3 to 5, the first connector 10 comprises a dielectric first housing 12 and a plurality of conductive first contacts 14 retained in the first housing 12 and spaced apart from each other with a fine pitch.

The first housing 12 comprises a first main body 122 defining a receiving space 124 in a mating face 121 thereof and forming a pair of side wings 126 extending rearward from a rear face 123 opposite to the mating face 121. A first retaining block 125 is retained in the first main body 122 and forms a projection plate 1252 extending into the receiving space 124 and defining a plurality of passageways (not labeled) therein. The side wings 126 define a pair of latching recesses 127 facing each other.

Figure 6:
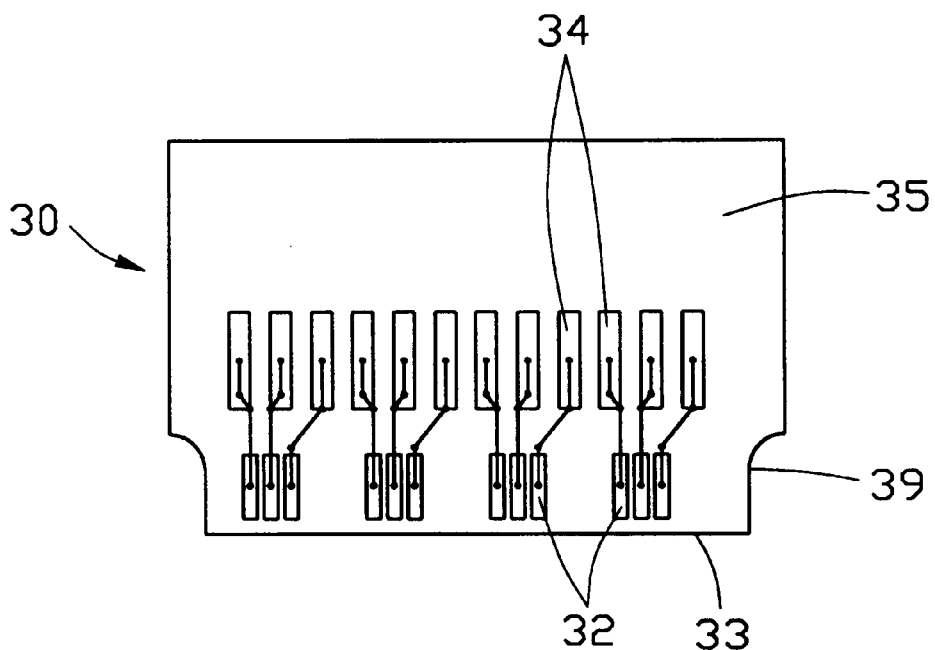
FIG. 6 is a top view of a PCB of FIG. 1.
Figure 7:
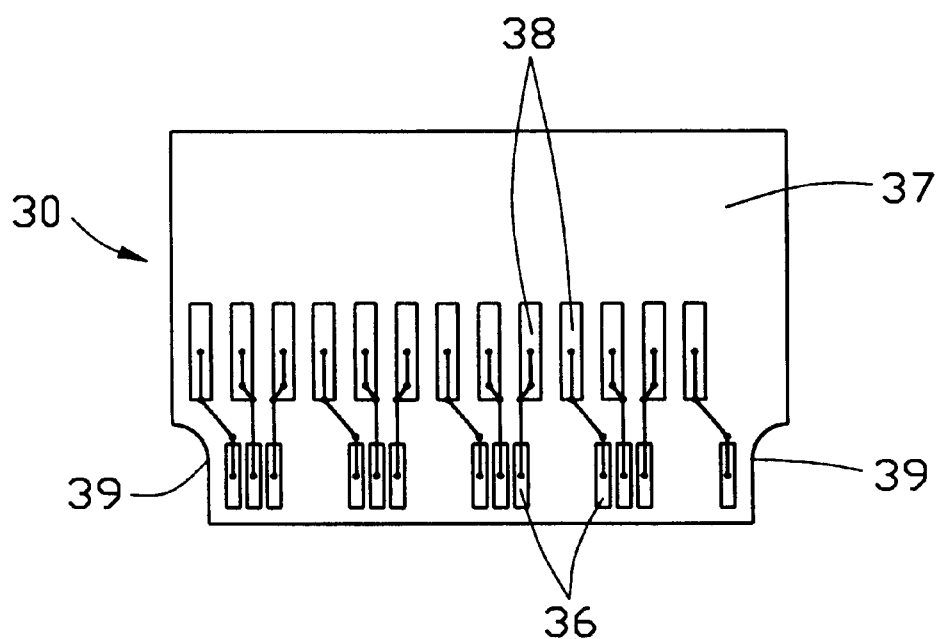
FIG. 7 is a bottom view of a PCB of FIG. 1.

Each first contact 14 comprises a retaining portion 140 retained in the first retaining block 125, a mating portion 142 extending from one end of the retaining portion 140 and a soldering portion 144 extending from the other end of the retaining portion 140. The mating portions 142 of the second contacts 14 are arranged in a single row and are accommodated in corresponding passageways of the projection plate 1252 for mating with corresponding engaging portions 242 of the second terminals 24 of the second connector 20. The soldering portions 144 are adapted for electrically connecting with the PCB 30 as will be described in detail hereinafter and are arranged in a pattern of alternating upper and lower groups extending along upper and lower rows. Each upper group comprises three adjacent soldering portions, designated as 144a, and each soldering portion 144a extends obliquely upward and rearward from a respective retaining portion 140, and then extends horizontally rearward. Each lower group also comprises three adjacent soldering portions, designated as 144b, and each soldering portion 144b extends obliquely downward and rearward and then extends horizontally rearward. Additionally, the lower groups of soldering portions 144b further include a single soldering portion 144b adjacent to one side wing 126. The upper groups of soldering portions 144a are coplanar with each other, and the lower groups of soldering portion 144b are also coplanar with each other. Moreover, a distance between the upper and lower groups of soldering portions 144a, 144b is substantially equal to a thickness of the PCB 30. Referring to FIGS. 6 and 7, the PCB 30 forms a row of first circuit traces 32 and a row of second circuit traces 34 electrically connected to respective first circuit traces 32 on a top surface 35 of the PCB 30. The row of first circuit traces 32 extends along and is adjacent to a front edge 33 of the PCB 30 and is arranged in groups of three adjacent first circuit traces 32 spaced apart from each other with a fine pitch for contacting the corresponding upper groups of soldering portions 144a of the first connector 10. The second circuit traces 34 are spaced apart from each other by a distance much larger than the fine pitch distance between the first circuit traces 32 and are for electrically connecting with corresponding conductors of the cable (not shown) by soldering. The PCB 30 further forms a row of third circuit traces 36 and a row of fourth circuit traces 38 electrically connecting to respective third circuit traces 36 on a bottom surface 37 thereof. The row of third circuit traces 36 and the row of fourth circuit traces 38 are arranged in a way similar to those of the first and second circuit races 32, 34, respectively. The groups of third circuit traces 36 are adapted for conductively contacting corresponding lower groups of soldering portions 144b of the first connector 10. The fourth circuit traces 38 are adapted for electrically connecting with corresponding conductors of the cable (not shown) by soldering. Additionally, a pair of elongated cutouts 39 are defined in opposite side edges (not labeled) of the PCB 30 and adjacent to the front edge 33 for facilitating insertion between the pair of side wings 126 of the first electrical connector 10.

Figure 8:
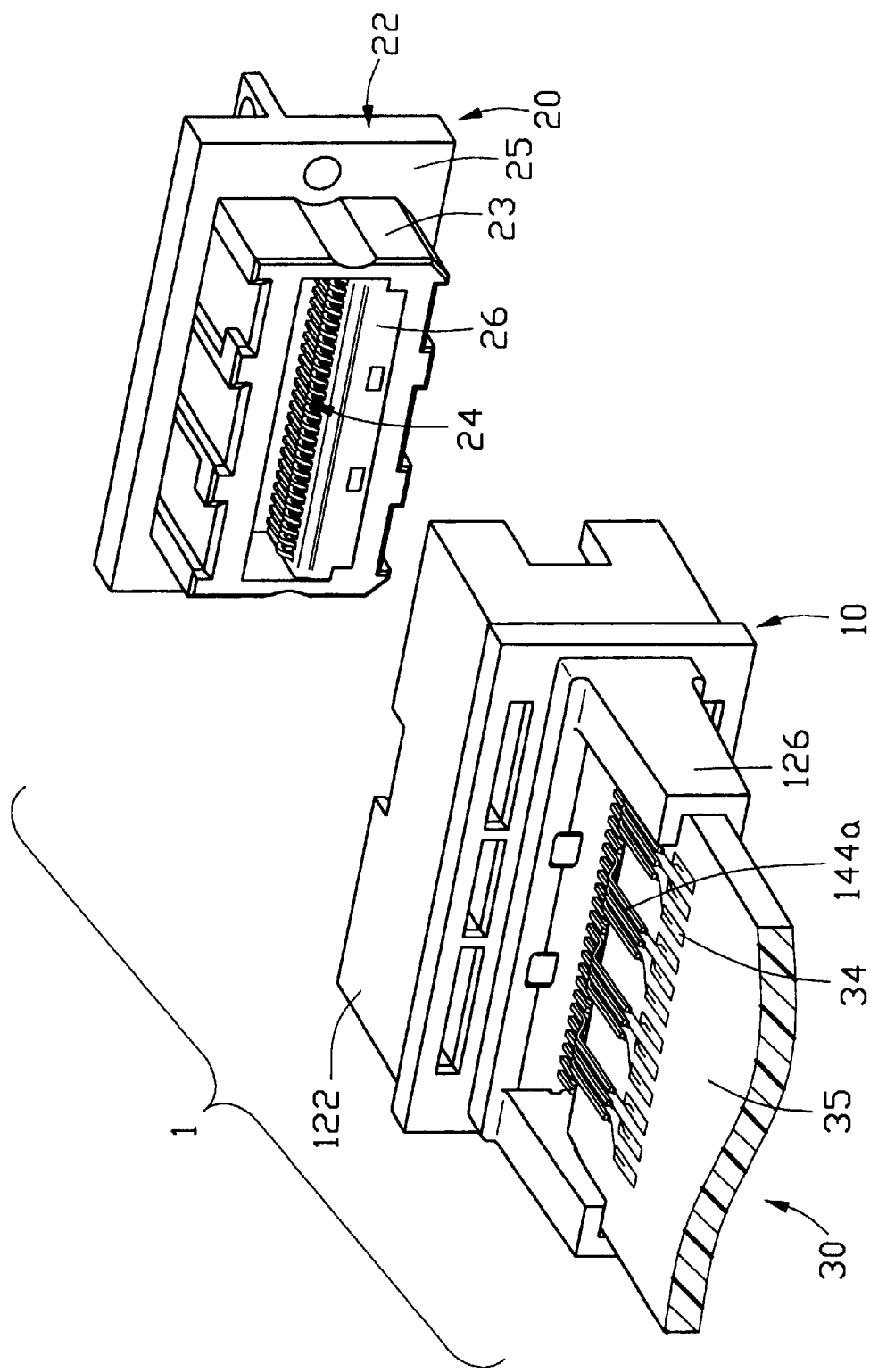
FIG. 8 is a partially assembled view of FIG. 1.
Figure 9:
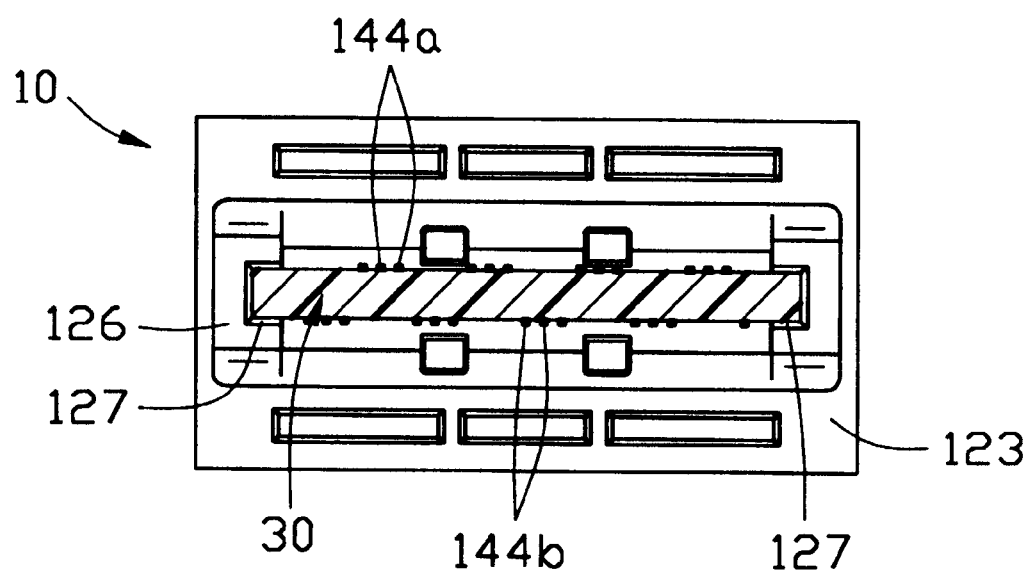
FIG. 9 is a rear view of the connector of FIG. 5 assembled with the PCB of FIG. 8.

In assembly, referring to FIGS. 8 to 9, the PCB 30 is first inserted between the upper and lower groups of soldering portions 144a and 144b of the first electrical connector 10. The opposite side edges (not labeled) of the PCB 30 to a near of the cutouts 39 are engaged with corresponding latching recesses 127 of the side wings 126 of the first connector 10. The upper and lower groups of soldering portions 144a, 144b are soldered to corresponding groups of first and third circuit traces 32, 36, respectively. The conductors of the cable are selectedly soldered to corresponding second and fourth circuit traces 34, 38 of the PCB 30, respectively. Since the distance between any two adjacent second or fourth circuit traces 34 or 38 is much larger than the fine pitch distance, the conductors of the cable are securely and easily soldered to the corresponding second and fourth circuit traces 34, 38 without the disadvantages associated with the prior arts.

In use, the shroud 23 of the second connector 20 is inserted into the receiving space 124 of the first connector 10 and the engaging portions 242 of the second terminals 24 of the second connector 20 are mated with corresponding mating portions 142 of the first contacts 14 of the first connector 10. Therefore, the electrically assembly 1 is effectively and electrically connected with the conductors of the cable.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector assembly for terminating a cable, comprising:

an electrical first connector comprising a dielectric first housing having a first main body and a plurality of conductive first contacts retained in the first main body, said first contacts being spaced apart from each other with a fine pitch distance and each comprising a retaining portion, and a mating portion and a soldering portion extending from opposite ends of the retaining portion, the mating portions being arranged in a single row and the soldering portions being arranged in alternating upper and lower groups, the upper groups being arranged in an upper row and the lower groups being arranged in a lower row;

an electrical second connector being matable with the electrical first connector and comprising a dielectric second main body and a plurality of second terminals retained in the second main body, each second terminal being engageable with a corresponding first contact of the first connector; and a printed circuit board (PCB) being adapted for connecting the first connector to a cable, said PCB having: on a top surface thereof a row of first circuit traces arranged in groups corresponding in position and pitch to the upper groups of the soldering portions in the upper row of the first contacts and a row of second circuit traces spaced from each other by a larger distance than the fine pitch of the first circuit traces, and on a bottom surface thereof a row of third circuit traces arranged in groups corresponding in a position and pitch to the lower groups of the soldering portions in the lower row of the first contacts, and a row of fourth circuit traces spaced from each other by a larger distance than the fine pitch of the third circuit traces, each first and third circuit trace being adapted for electrically contacting with a corresponding soldering portion in a corresponding upper and lower row, respectively, of the first connector, and each second and fourth circuit trace being electrically connected to a corresponding first and third circuit trace, respectively, and also being adapted to be electrically connected to a corresponding conductor of the cable;

wherein the first main body defines a receiving space in a mating face thereof;

wherein a first retaining block is assembled with the first main body and forms a projection plate extending into the receiving space of the first main body;

wherein the projection plate defines a plurality of passageways for accommodating the mating portions of corresponding first contacts;

wherein a pair of side wings extends from a rear face of the first main body opposite to the mating face and the side wings define a pair of latching recesses facing each other for engaging with opposite side edges of the PCB;

wherein the soldering portions of the first contacts are arranged in alternating upper and lower groups and each upper or lower group comprises three adjacent soldering portions;

wherein the upper groups of soldering portions are coplanar with each other in the upper row, and the lower groups of soldering portions are also coplanar with each other in the lower row;

wherein a distance between the upper and lower rows is substantially equal to a thickness of the PCB;

wherein each soldering portion of the upper rows extends obliquely upwardly and rearwardly from the retaining portion and then extends horizontally rearwardly for soldering to a corresponding first circuit trace on the top surface of the PCB;

wherein each soldering portion of the lower rows extends obliquely downwardly and rearwardly from the retaining portion and then horizontally rearwardly for soldering to a corresponding third circuit trace on the bottom surface of the PCB;

wherein the second main body of the second connector forms a shroud extending from a rear side thereof for insertion into the receiving space of the first connector;

wherein a second retaining block is assembled into the s second main body and defines a plurality of channels for accommodating corresponding second terminals.

\* \* \* \* \*